United States Patent
Chen et al.

(10) Patent No.: US 9,293,340 B2
(45) Date of Patent: Mar. 22, 2016

(54) SURFACE PLANARIZATION METHOD OF THIN FILM AND PREPARING METHOD OF ARRAY SUBSTRATE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Lei Chen, Beijing (CN); Ziqi Xia, Beijing (CN); Wukun Dai, Beijing (CN); Jiapeng Li, Beijing (CN); Xiuhong Jin, Beijing (CN); Fengguo Wang, Beijing (CN); Lei Zhang, Beijing (CN); Miao Qiu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/347,819

(22) PCT Filed: Jun. 5, 2013

(86) PCT No.: PCT/CN2013/076811
§ 371 (c)(1),
(2) Date: Mar. 27, 2014

(87) PCT Pub. No.: WO2014/153839
PCT Pub. Date: Oct. 2, 2014

(65) Prior Publication Data
US 2015/0064927 A1    Mar. 5, 2015

(51) Int. Cl.
*B44C 1/22* (2006.01)
*H01L 21/3065* (2006.01)
*H01L 21/308* (2006.01)
*G02F 1/1362* (2006.01)
*G02F 1/1333* (2006.01)

(52) U.S. Cl.
CPC ...... *H01L 21/3065* (2013.01); *G02F 1/136286* (2013.01); *H01L 21/308* (2013.01); *G02F 2001/133357* (2013.01); *G02F 2001/136295* (2013.01)

(58) Field of Classification Search
CPC ............. H01L 21/3065; H01L 21/304; H01L 21/02013; H01L 21/02024; H01L 21/02019
USPC .................................................. 216/38, 52
See application file for complete search history.

(56) References Cited

U.S. PATENT DOCUMENTS

| 6,188,452 | B1 | 2/2001 | Kim et al. |
| 2007/0020825 | A1 | 1/2007 | Cho et al. |
| 2013/0001579 | A1* | 1/2013 | Jung et al. ......... 257/72 |

FOREIGN PATENT DOCUMENTS

| CN | 1901158 A | 1/2007 |
| CN | 101312130 A | 11/2008 |
| CN | 101330050 A | 12/2008 |

OTHER PUBLICATIONS

International Search Report for International Application No. PCT/CN2013/076811 issued Nov. 22, 2013.
First Chinese Office Action dated Apr. 29, 2015; Appln. No. 201310096225.7.
International Preliminary Report on Patentability Appl. No. PCT/CN2013/076811; Dated Sep. 29, 2015.

* cited by examiner

*Primary Examiner* — Roberts Culbert
(74) *Attorney, Agent, or Firm* — Ladas & Parry LLP

(57) ABSTRACT

A surface planarization method of thin film and a preparing method of an array substrate relate to a display field, and can solve the technical problem that the conventional dry etching severely damages the surface flatness of other film layers below the one being etched, thereby improving the display properties of the LCD. The preparing method of the array substrate comprises patterning a non-metallic layer (4) by a dry etching. And following the step of patterning a non-metallic layer (4) by the dry etching, the method further comprises performing surface planarization on a first film layer (3) to recover the first film layer (3) with a rough surface caused by the dry etching to be planar. The first film layer (3) is located below the non-metallic layer (4).

11 Claims, 2 Drawing Sheets

SURFACE PLANARIZATION METHOD OF THIN FILM AND PREPARING METHOD OF ARRAY SUBSTRATE

CROSS REFERENCE TO RELATED APPLICATIONS

This application is based on International Application No. PCT/CN2013/076811 filed on Jun. 5, 2013, which claims priority to Chinese National Application No. 201310096225.7 filed on Mar. 25, 2013. The entire contents of each and every foregoing application are incorporated herein by reference.

BACKGROUND

The present disclosure relates to a surface planarization method of thin film and a preparing method of array substrate.

Dry etching, a processing technology commonly used in semiconductor manufacture field, usually utilizes a RF source to trigger plasma discharging in working gas, thereby generating ions and radicals which, under the effect of electrical filed, cause ion bombardment on substances on a substrate and exposed by a patterned layer of photoresist, so as to transfer patterns defined by a mask to the substrate.

The dry etching is typically configured for patterning a non-metallic layer such as a semiconductor layer during the preparation of an array substrate of a LCD (Liquid Crystal Display). Since it is usually performed in a form of ion bombardment, the dry etching severely damages the surface flatness of other film layers (e.g. a gate insulating layer in a TFT with a bottom-gate structure) below the etched layer, thus the film surface becomes rough. This on one hand adversely affects the growth of the metallic grains and the deposition of source/metallic layer, and on the other hand also adversely affects the transmittance and contrast ratio of the LCD.

SUMMARY

The present invention provides a surface planarization method of thin film and a preparing method of array-substrate to solve the technical problem that the existing dry etching greatly damages the surface flatness of other film layers below the one being etched, thereby improving the transmittance and contrast ratio of the LCD.

According to embodiments of the present disclosure, a surface planarization method of thin film after dry etching is provided. After patterning a non-metallic layer located above a first film layer by dry etching, surface planarization is performed on the exposed first film layer exposed by the dry etching so as to recover the first film layer with a rough surface caused by the dry etching to be planar.

In particular, a chemically reactive gas is introduced into an apparatus configured for the dry etching to react with the exposed first film layer by dry etching to produce volatile substances, so that a surface of the first film layer is planarized.

Optionally, the first film layer is a silicon nitride film, and the chemically reactive gas is a gas mixture including oxygen and sulfur hexafluoride.

The gas mixture further includes helium. The helium has a content of 20%-40% by volume, the oxygen has a content of 30%-40% by volume, and the sulfur hexafluoride has a content of 30%-40% by volume in the gas mixture.

The present embodiment also provides a preparing method of array substrate. The method comprises patterning a non-metallic layer located above a first film layer by dry etching; and performing surface planarization on the exposed first film layer after the dry etching to recover the first film layer with a rough surface caused by the dry etching to be planar.

Optionally, the step of performing surface planarization on the first film layer comprises: introducing a chemically reactive gas into an apparatus configured for the dry etching to react with the exposed first film layer after the dry etching to produce volatile substances, so that a surface of the first film layer is planarized.

Optionally, the non-metallic layer is a semiconductor layer.

Optionally, the first film layer is a silicon nitride film, and the chemically reactive gas is a gas mixture including oxygen and sulfur hexafluoride.

Optionally, the gas mixture further includes helium.

Preferably, the helium has a content of 20%-40% by volume, the oxygen has a content of 30%-40% by volume, and the sulfur hexafluoride has a content of 30%-40% by volume.

Preferably, the helium has a content of 30%-35% by volume, the oxygen has a content of 35%-40% by volume, and the sulfur hexafluoride has a content of 25%-30% by volume in the gas mixture.

Preferably, the chemically reactive gas reacts with the first film layer for 5-45 s.

More preferably, the chemically reactive gas reacts with the first film layer for 5-15 s.

The present disclosure further provides an array substrate comprising a non-metallic layer located above a first film layer and patterned by dry etching. The array substrate is further subjected to a planarization process following the dry etching during the preparation of the array substrate. The planarization process recovers the first film layer with a rough surface caused by the dry etching to be planar.

The present disclosure further provides a display device comprising the array substrate.

The present disclosure provides a surface planarization method of thin film, an array substrate and a preparing method of the array substrate, as well as a display device. The present disclosure provides additional surface planarization process following a conventional dry etching to recover a relatively rough surface of a film layer damaged by the dry etching to be planar, so that any adverse effect on subsequent processes caused by the dry etching can be avoided, thereby improving the transmittance and contrast ratio of the LCD.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

In order to better explain the technical solution of the present disclosure or the prior art, hereinafter the drawings necessary for the description of the technical solution as provided by the present disclosure or the prior art will be described briefly. Obviously, the drawings referred by the following description are only illustration of a part of detailed embodiments of the technical solution according to the present disclosure, based on which those skilled in the art can derive other drawings without any creative labor.

DETAILED DESCRIPTION OF THE PREFERRED EMBODIMENTS

Figure 1:
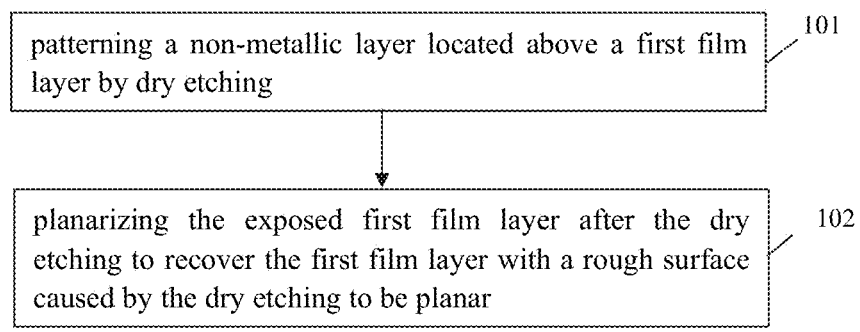
FIG. 1 is a flowchart illustrating a preparing method of array substrate according to the present disclosure.

Hereinafter the technical solutions of embodiments according to the present disclosure will be described clearly and completely. Obviously, those described herein are only part but not all of the embodiments of the present disclosure. All other embodiments that can be made by those skilled in the art without any creative labor based on the embodiments of the present disclosure shall be included within the scope of the present disclosure.

Unless specified otherwise, the technical terms or scientific terms used herein shall refer to common meanings known to a common skilled person in the filed to which the present disclosure is pertaining. The wordings "first", "second" and the same that are used in the specification do not indicate any sequence, amount or importance, but only to distinguish different components. Likewise, wordings such as "one" or "a" and the same do not indicate any limit to the amount either, but indicate an existence of at least one. Wordings "connect" or "connect with" and the same are not limited to physical or mechanical connection, but can include electrical connection in either direct or indirect way. Wordings "upper", "lower", "left", "right" and the same are used to indicate relative location relations which vary correspondingly with the absolute location of the described object.

The embodiments of the present disclosure provides a surface planarization method for thin film, an array substrate and preparing method thereof, as well as a display device. The present disclosure provides additional planarization process following a conventional dry etching to recover a relatively rough surface of a film layer which is damaged by the dry etching to be planar, so that any influence to subsequent processes caused by the dry etching can be avoided, thereby improving the transmittance and contrast ratio of the LCD.

Hereinafter the technical solutions of embodiments according to the present disclosure will be described clearly and completely.

The present disclosure provides a treatment method for surface planarization of thin film after dry etching. After patterning a non-metallic layer located above a first film layer by dry etching, surface planarization is performed on the exposed first film layer damaged by the dry etching to recover the rough surface of the first film layer to be planar.

Dry etching, a pattern transferring method commonly used in semiconductor filed, usually is carried out by bombarding a film layer exposed by a protective photoresist layer (or other protective layer) with ions, so that a film layer pattern protected by the photoresist remains. However, at the same time, it also damages the surface flatness of the exposed first film layer below the one being etched. When the first film layer is made of non-metallic material, such damage is especially severe, which roughens the first film layer and adversely affects subsequent film formation. For example, if it is required to further deposit a metallic film layer in subsequent process, a rough surface of the first film layer would adversely affect the growth of metallic grains, thus the deposition of the metallic film layer.

To this end, the embodiments of the present disclosure provide an additional planarization process following a conventional dry etching to recover a relatively rough surface of a film layer damaged by the dry etching to be planar, so that any adverse effects on subsequent processes caused by the dry etching can be avoided.

In particular, a chemically reactive gas is introduced into an apparatus configured for dry etching to react with the exposed first film layer in the dry etching so as to produce volatile substances, thereby the surface of the first film layer is planarized.

For example, when the first film layer is a silicon nitride film, the chemically reactive gas can be a gas mixture including oxygen and sulfur hexafluoride. The simplified reaction formula is as following: $Si+4F \longrightarrow SiF_4 \uparrow$. During the reaction, the silicon nitride serves as the predominant reactant gas, while the oxygen mainly serves to increase the activity of F ions.

The gas mixture can further include helium for cooling and anti-static purposes.

Preferably, the helium has a content of 20%-40% by volume, the oxygen has a content of 30%-40% by volume, and the sulfur hexafluoride has a content of 30%-40% by volume in the gas mixture.

For example, the chemically reactive gas can be a gas mixture comprised of 30% oxygen, 20% helium and 30% sulfur hexafluoride, or, can be a gas mixture comprised of 20% oxygen, 40% helium and 40% sulfur hexafluoride, or, can also be gas mixture comprised of 30% oxygen, 35% helium and 35% sulfur hexafluoride.

Preferably, the helium has a content of 30%-35% by volume, the oxygen has a content of 35%-40% by volume, and the sulfur hexafluoride has a content of 25%-30% by volume in the gas mixture, which can produce a more smooth film surface.

Preferably, the chemically reactive gas (e.g., gas mixture) reacts with the first film layer for 5 s-45 s.

More preferably, the chemically reactive gas (e.g., gas mixture) reacts with the first film layer for 5-15 s, in particular, for 5 s, 7 s, 10 s, 12 s, 15 s or so on.

An excessive long reaction time may result in over etching of the thin film, thereby adversely affecting the properties of the thin film, whereas an insufficient short reaction time may result in an insufficient planarization of the thin film surface being etched. Therefore, a reaction time within the above-mentioned range is preferable.

The present disclosure provides a surface planarization method for thin film which adds a processing step of surface planarization following a conventional dry etching so as to planarize a relatively rough surface of a film layer damaged by the dry etching, so that any influence to subsequent processes caused by the dry etching can be avoided.

As shown in FIG. 1, the preparing method of array substrate according to the present disclosure comprises steps of:

101, patterning a non-metallic layer located above a first film layer by dry etching; and 102, planarizing the first film layer to recover the surface flatness of the first film layer with a rough surface caused by the dry etching.

The first film layer can be any film layer located below the one being etched; for example, the first film layer can be a gate insulating layer in an array substrate with TFT which has a bottom-gate structure and a non-metallic semiconductor layer.

During the preparation of the array substrate, a process of dry etching is usually required to etch the non-metallic layer; however, such process damages the surface flatness of a first film layer below the one being etched. Such damage is especially severe when the first film layer is made of non-metallic material, and the surface of the first film layer becomes rough, thereby severely affecting the display performance of LCD device. To this end, the embodiments of the present disclosure add a surface planarization step following the dry etching to recover the surface flatness of the first film layer with a relatively rough surface caused by the dry etching, so that any adverse effect on subsequent processes caused by the dry etching can be avoided, thereby improving the transmittance and contrast ratio of the LCD.

In particular, the process of surface planarization of the present embodiment can be implemented by various ways, for example, wet etching, mechanical polishing, and the like, which can be selected depending on the material of the first film layer to be processed considering compatibility with previous processing steps and subsequent processing steps.

Hereinafter specific examples are described in details so that the skilled in the art could readily understand the technical solutions of the preparing method of array substrate provided in the embodiments of the present disclosure.

Figure 2:
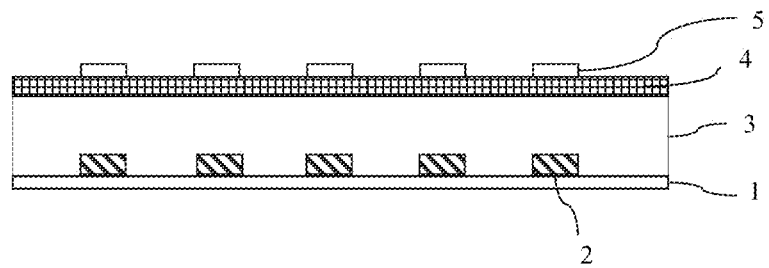
FIG. 2 is a sectional schematic view illustrating the array substrate before performing dry etching on the semiconductor layer according to the present disclosure.

As shown in FIG. 2, gates 2 are disposed on a substrate 1, and a gate insulating layer 3 (typically a thin film of silicon nitride) and a semiconductor layer 4 are sequentially deposited on the gate 2. The semiconductor layer 4 is coated with a layer of photoresist and subjected to exposure and development so that a patterned layer of photoresist 5 remains on prescribed locations where TFTs will be formed subsequently.

Figure 3:
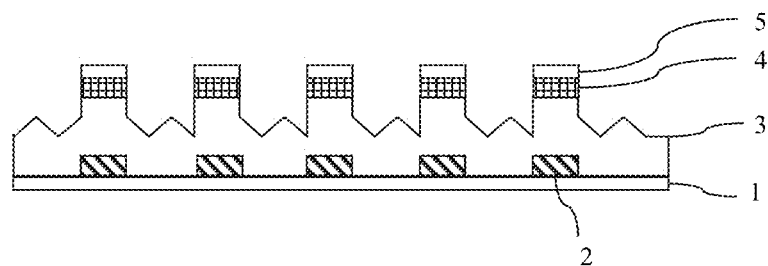
FIG. 3 is a sectional schematic view illustrating the array substrate after performing dry etching on the semiconductor layer according to the present disclosure.

Next, as shown in FIG. 3, under the effect of radio frequency, the semiconductor layer 4 exposed by the patterned layer of photoresist 5 is bombarded by means of vacuum plasma method so as to pattern the semiconductor layer 4 on the array substrate by dry etching. However, after performing dry etching on the semiconductor layer 4, the exposed gate insulating layer 3 (that is, the first film layer according to the present disclosure) located below the semiconductor layer 4 would be severely damaged due to ion bombardment, which severely roughens the exposed surface of the gate insulating layer and adversely affects the display performance.

Figure 4:
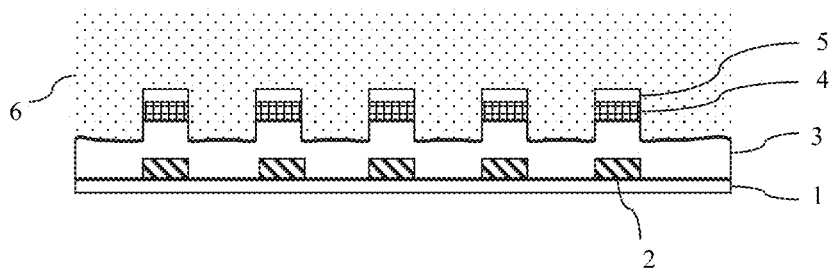
FIG. 4 is a sectional schematic view illustrating the array substrate subjected to planarization recovery after dry etching according to a second embodiment of the present disclosure.
Figure 5A:
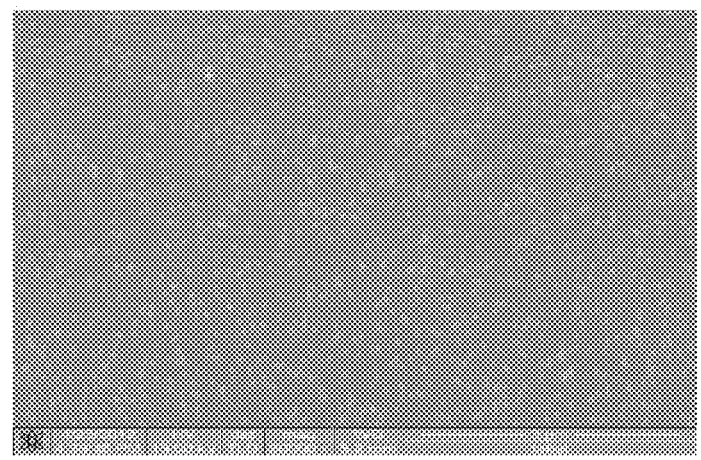
FIG. 5A and FIG. 5B are scanning electron microscope (SEM) photographs of a surface of the first film layer after and before the planarization recovery process, respectively.
Figure 5B:
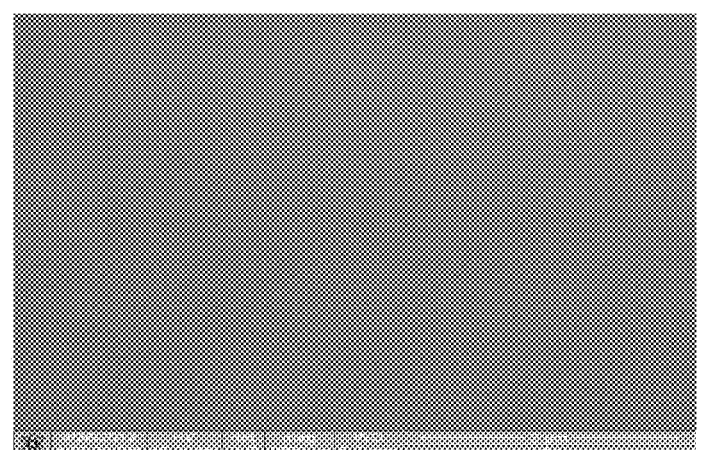

To this end, as shown in FIG. 4, in the present embodiment, a chemically reactive gas 6 for planarization is introduced into an apparatus configured for dry etching, so that the chemically reactive gas 6 reacts with the exposed gate insulating layer 3 (that is, the first film layer) after the dry etching. Thus the exposed surface of the gate insulating layer 3 is planarized. As shown in FIGS. 5A and 5B, a relatively rough surface of the gate insulating layer 3 damaged by the dry etching recovers to be planar after the planarization process.

In the present embodiment, the planarization process can be implemented in the same apparatus configured for dry etching. Since no working gas necessary for dry etching is introduced, there is no ion bombardment in the dry etching occurred to the first film layer, only the chemically reactive gas 6 is ionized into ions so as to facilitate the reaction between the chemically reactive gas 6 and the first film layer.

Optionally, the gate insulating layer 3 is a silicon nitride film; the chemically reactive gas 6 is a gas mixture including oxygen ($O_2$) and sulfur hexafluoride ($SF_6$), which has an oxidization reaction with the gate insulating layer 3 exposed by the photoresist to generate volatile substance for achieving etching effect, so that the rough surface of the gate insulating layer 3 is planarized after the treatment of chemical reaction. Due to difference in the nitrogen content in silicon nitride upon deposition of the gate insulating layer, only simplified chemical reaction formulas is shown as following without specific details: $Si+4F—SiF_4\uparrow$. During the reaction, the sulfur hexafluoride serves as the predominant reactant gas, while the oxygen mainly serves to increase the activity of F ions.

Further, the gas mixture can also include helium for cooling and anti-static purposes. Preferably, the helium has a content of 20%-40% by volume, the oxygen has a content of 30%-40% by volume, and the sulfur hexafluoride has a content of 30%-40% by volume in the gas mixture. For example, in one implement, the chemically reactive gas can be a gas mixture comprised of 30% oxygen, 20% helium and 30% sulfur hexafluoride, or, can be a gas mixture comprised of 20% oxygen, 40% helium and 40% sulfur hexafluoride, or, can also be gas mixture comprised of 30% oxygen, 35% helium and 35% sulfur hexafluoride.

Preferably, the helium has a content of 30%-35% by volume, the oxygen has a content of 35%-40% by volume, and the sulfur hexafluoride has a content of 25%-30% by volume in the gas mixture, which can produce a more smooth film surface.

Preferably, the chemically reactive gas (e.g., gas mixture) reacts with the first film layer for 5 s-45 s.

More preferably, the chemically reactive gas (e.g., gas mixture) reacts with the first film layer for 5-15 s, in particular, for 5 s, 7 s, 10 s, 12 s, 15 s or so on.

An excessive long reaction time may result in over etching of the thin film, thereby adversely affecting the properties of the thin film, whereas an insufficient short reaction time may result in an insufficient planarization of the thin film surface being etched. Therefore, a reaction time within the above-mentioned range is preferable.

According to the preparing method of array substrate provided in the present disclosure, following a conventional dry etching, a chemically reactive gas is introduced to react with a relatively rough surface of a film layer damaged by the dry etching, so that the surface of the film layer is planarized, thereby improving the display performance of LCD.

The embodiments of the present disclosure provide an array substrate comprising a non-metallic layer which is patterned through dry etching and located above a first film layer. The array substrate is further subjected to planarization process following the dry etching. The planarization process comprises: introducing a chemically reactive gas into an apparatus configured for dry etching to react with the exposed first film layer after the dry etching to planarize the exposed surface of the first film layer.

Optionally, the non-metallic layer is a semiconductor layer, the first film layer is a silicon nitride film, and the chemically reactive gas is a gas mixture including oxygen and sulfur hexafluoride.

Further, the gas mixture can also include helium.

The array substrate provided in the present disclosure is subjected to the surface planarization process following the conventional dry etching, thus a relatively rough surface of a film layer damaged by the dry etching can recover to be planar, thereby improving the display performance of LCD.

The present disclosure further provides a display device comprising the array substrate described as above. The present disclosure therefore can improve the display performance of LCD.

Although the array substrate is described as examples in the embodiments of the present disclosure, it should be understood that the application of the present disclosure is not The above embodiments in only for illustrating the present disclosure and not for limiting the present disclosure. The skilled in the art can implement various modifications and variations without departing from the spirit and scope of the present disclosure, and all equivalent technical solutions fall into the scope of the present disclosure. The protection scope of the present disclosure is defined by appended claims.

What is claimed is:

1. A surface planarization method of thin films, comprising:
    patterning a non-metallic layer located above a first film layer by dry etching in an apparatus with a dry-etching working gas configured for the dry etching, wherein the dry etching causes the first film layer to be exposed with a rough surface; and
    planarizing the exposed first film layer to smooth the rough surface of the exposed first film layer to be planar, wherein planarizing the exposed first film layer comprises:
        introducing into the same apparatus configured for the dry etching a chemically reactive gas that is different from the dry-etching working gas,
        wherein the chemically reactive gas reacts with the exposed first film layer to generate volatile substances so that the rough surface of the exposed first film layer is planarized.

2. The method according to claim 1, wherein: the first film layer is a silicon nitride film, and the chemically reactive gas is a gas mixture including oxygen and sulfur hexafluoride.

3. The method according to claim 2, wherein: the gas mixture further includes helium; the helium has a content of 20%-40% by volume, the oxygen has a content of 30%-40% by volume, and the sulfur hexafluoride has a content of 30%-40% by volume in the gas mixture.

4. A preparing method of an array substrate, comprising:
    patterning a non-metallic layer located above a first film layer by dry etching in an apparatus with a dry-etching working gas configured for the dry etching, wherein the dry etching causes the first film layer to be exposed with a rough surface; and
    performing surface planarization on the exposed first film layer to smooth the rough surface of the exposed first film layer to be planar, wherein planarizing the exposed first film layer comprises:
        introducing into the same apparatus configured for the dry etching a chemically reactive gas that is different from the dry-etching working gas,
        wherein the chemically reactive gas reacts with the exposed first film layer to generate volatile substances so that the rough surface of the exposed first film layer is planarized.

5. The preparing method according to claim 4, wherein the non-metallic layer is a semiconductor layer.

6. The preparing method according to claim 4, wherein: the first film layer is a silicon nitride film, and the chemically reactive gas is a gas mixture comprising oxygen and sulfur hexafluoride.

7. The preparing method according to claim 6, wherein the gas mixture further comprises helium.

8. The preparing method according to claim 7, wherein the helium has a content of 20%-40% by volume, the oxygen has a content of 30%-40% by volume, and the sulfur hexafluoride has a content of 20%-40% by volume in the gas mixture.

9. The preparing method according to claim 8, wherein the helium has a content of 30%-35% by volume, the oxygen has a content of 35%-40% by volume, and the sulfur hexafluoride has a content of 25%-30% by volume in the gas mixture.

10. The preparing method according to claim 7, wherein the chemically reactive gas reacts with the first film layer for 5-45 s.

11. The preparing method according to claim 10, wherein the chemically reactive gas reacts with the first film layer for 5-15 s.

* * * * *